(12) United States Patent
Moffat et al.

(10) Patent No.: US 6,831,506 B1
(45) Date of Patent: Dec. 14, 2004

(54) RECONFIGURABLE FILTER ARCHITECTURE

(75) Inventors: Mark Moffat, Santa Cruz, CA (US); Marcus Granger-Jones, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 10/665,234

(22) Filed: Sep. 17, 2003

(51) Int. Cl.$^7$ .............................................. H03B 1/00
(52) U.S. Cl. ....................................... 327/552; 327/553
(58) Field of Search ................................. 327/552, 551, 327/553, 554, 556, 557, 558, 559, 560; 455/126; 330/126

(56) References Cited

U.S. PATENT DOCUMENTS

| | | | | |
|---|---|---|---|---|
| 4,339,829 A | * | 7/1982 | Dimon ........................ 455/340 |
| 5,590,418 A | * | 12/1996 | Holoubek et al. ........... 455/126 |
| 5,608,353 A | | 3/1997 | Pratt ........................... 330/295 |
| 5,629,648 A | | 5/1997 | Pratt ........................... 330/289 |
| 6,130,579 A | | 10/2000 | Iyer et al. .................... 330/285 |
| 6,191,656 B1 | | 2/2001 | Nadler ........................ 330/288 |
| 6,229,395 B1 | | 5/2001 | Kay ............................ 330/252 |
| 6,265,943 B1 | | 7/2001 | Dening et al. .............. 330/296 |
| 6,271,727 B1 | | 8/2001 | Schmukler .................. 330/284 |
| 6,285,239 B1 | | 9/2001 | Iyer et al. .................... 327/531 |
| 6,307,364 B1 | | 10/2001 | Augustine ..................... 324/95 |
| 6,313,705 B1 | | 11/2001 | Dening et al. .............. 330/276 |
| 6,329,809 B1 | | 12/2001 | Dening et al. ................ 324/95 |
| 6,333,677 B1 | | 12/2001 | Dening ........................ 330/296 |
| 6,356,150 B1 | | 3/2002 | Spears et al. ............... 330/145 |
| 6,369,656 B2 | | 4/2002 | Dening et al. .............. 330/296 |
| 6,369,657 B2 | | 4/2002 | Dening et al. .............. 330/296 |
| 6,392,487 B1 | | 5/2002 | Alexanian ................... 330/254 |
| 6,404,287 B2 | | 6/2002 | Dening et al. .............. 330/296 |
| 6,418,174 B1 | | 7/2002 | Benedict ..................... 375/303 |
| 6,448,793 B1 | | 9/2002 | Barratt et al. ............... 324/693 |
| 6,448,831 B1 | | 9/2002 | Hunt, Jr. et al. ............ 327/211 |
| 6,525,611 B1 | | 2/2003 | Dening et al. .............. 330/298 |
| 6,528,983 B1 | | 3/2003 | Augustine ..................... 324/95 |
| 6,560,452 B1 | | 5/2003 | Shealy ........................ 455/333 |
| 6,566,963 B1 | | 5/2003 | Yan et al. .................... 330/311 |
| 6,606,489 B2 | | 8/2003 | Razavi et al. ............... 455/323 |
| 6,608,367 B1 | | 8/2003 | Gibson et al. .............. 257/666 |
| 6,621,140 B1 | | 9/2003 | Gibson et al. .............. 257/531 |
| 6,624,702 B1 | | 9/2003 | Dening ........................ 330/297 |
| 6,647,077 B1 | | 11/2003 | Shan et al. .................. 375/346 |
| 6,657,592 B2 | | 12/2003 | Dening et al. ....... 343/700 MS |
| 6,658,265 B1 | | 12/2003 | Steel et al. ............. 455/553.1 |
| 6,661,834 B1 | | 12/2003 | Shan et al. .................. 375/147 |
| 6,670,914 B1 | | 12/2003 | Najarian et al. ....... 342/357.06 |
| 6,683,905 B1 | | 1/2004 | King et al. .................. 375/141 |
| 6,693,468 B2 | | 2/2004 | Humphreys et al. ........ 327/105 |
| 6,700,929 B1 | | 3/2004 | Shan et al. .................. 375/224 |
| 6,701,134 B1 | | 3/2004 | Epperson .................... 455/102 |
| 6,701,138 B2 | | 3/2004 | Epperson et al. ........ 455/127.3 |
| 6,710,664 B2 | | 3/2004 | Humphreys et al. .......... 331/11 |
| 6,720,831 B2 | | 4/2004 | Dening et al. .............. 330/298 |
| 6,724,252 B2 | | 4/2004 | Ngo et al. ................... 330/133 |
| 6,724,265 B2 | | 4/2004 | Humphreys .................. 331/17 |
| 6,728,324 B1 | | 4/2004 | Shan et al. .................. 375/346 |
| 6,731,145 B1 | | 5/2004 | Humphreys et al. ........ 327/156 |
| 6,748,204 B1 | | 6/2004 | Razavi et al. ............... 455/296 |
| 2003/0160307 A1 | | 8/2003 | Gibson et al. .............. 257/666 |
| 2003/0209730 A1 | | 11/2003 | Gibson et al. .............. 257/201 |
| 2004/0072597 A1 | | 4/2004 | Epperson et al. .......... 455/572 |

* cited by examiner

*Primary Examiner*—Linh My Nguyen
(74) *Attorney, Agent, or Firm*—Withrow & Terranova, PLLC

(57) ABSTRACT

The present invention provides a reconfigurable filter having a bandwidth and frequency offset that are independently configured, thereby allowing the filter to realize any filter pole. In general, the filter includes a filtering stage and a reverse gain stage. The filtering stage has a bandwidth configured by a bandwidth control signal from control logic and a frequency offset configured by an offset control signal. The reverse gain stage provides the offset control signal to the filtering stage based a reverse gain control signal from the control logic and the output signal. Based on the bandwidth control signal and the reverse gain control signal, the bandwidth of the filter is configured independently from the frequency offset of the filter and the frequency offset is configured independently from the bandwidth.

37 Claims, 3 Drawing Sheets

_US 6,831,506 B1_

RECONFIGURABLE FILTER ARCHITECTURE

FIELD OF THE INVENTION

The present invention relates to a reconfigurable filter architecture, and more particularly to a filter architecture having independently configurable gain, bandwidth, and frequency offset.

BACKGROUND OF THE INVENTION

Multimode receivers are capable of receiving signals according to multiple standards such as the Global System for Mobile Communications (GSM) and Wideband Code-Division-Multiple-Access (WCDMA). In order to accommodate multiple standards, multimode receivers require a variety of different filtering options. In modern receiver architectures, received signals are downcoverted from a radio frequency (RF) to either a very low intermediate frequency (VLIF) or to DC and filtered to remove adjacent channel signals before analog to digital conversion. Filtering at a VLIF requires a filter having a bandpass response, wherein the center frequency of the filter is offset from DC, while filtering at DC requires a filter having a low-pass response. Thus, multimode receivers require separate filters having a passband at DC and at VLIF in order to filter adjacent channel signals before analog to digital conversion. Further, the adjacent channel spacing and widths vary according to standard, thereby requiring filters having varying bandwidths for each standard.

In order to accommodate the filtering requirements associated with multiple standards, multimode receivers typically include separate filters to accommodate different communication standards. However, these filters require large capacitors that consume valuable chip area. Therefore, there remains a need for a single filter architecture that is easily configurable to accommodate the different requirements of various communications standards.

SUMMARY OF THE INVENTION

The present invention provides a reconfigurable filter having a bandwidth and frequency offset that are independently configured, thereby allowing the filter to realize any filter pole. In general, the filter includes a filtering stage and a reverse gain stage. The filtering stage has a bandwidth configured by a bandwidth control signal from control logic and a frequency offset configured by an offset control signal. The reverse gain stage provides the offset control signal to the filtering stage based a reverse gain control signal from the control logic and the output signal. Based on the bandwidth control signal and the reverse gain control signal, the bandwidth of the filter is configured independently from the frequency offset of the filter and the frequency offset is configured independently from the bandwidth.

The filter may also include a forward gain stage that amplifies an input signal to provide the amplified input signal to the filtering stage. A gain of the forward gain stage is configured by a forward gain control signal from the control logic, thereby allowing the gain of the filter to be configured independently from the bandwidth and frequency offset while eliminating the need for additional amplifier stages before the filter.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
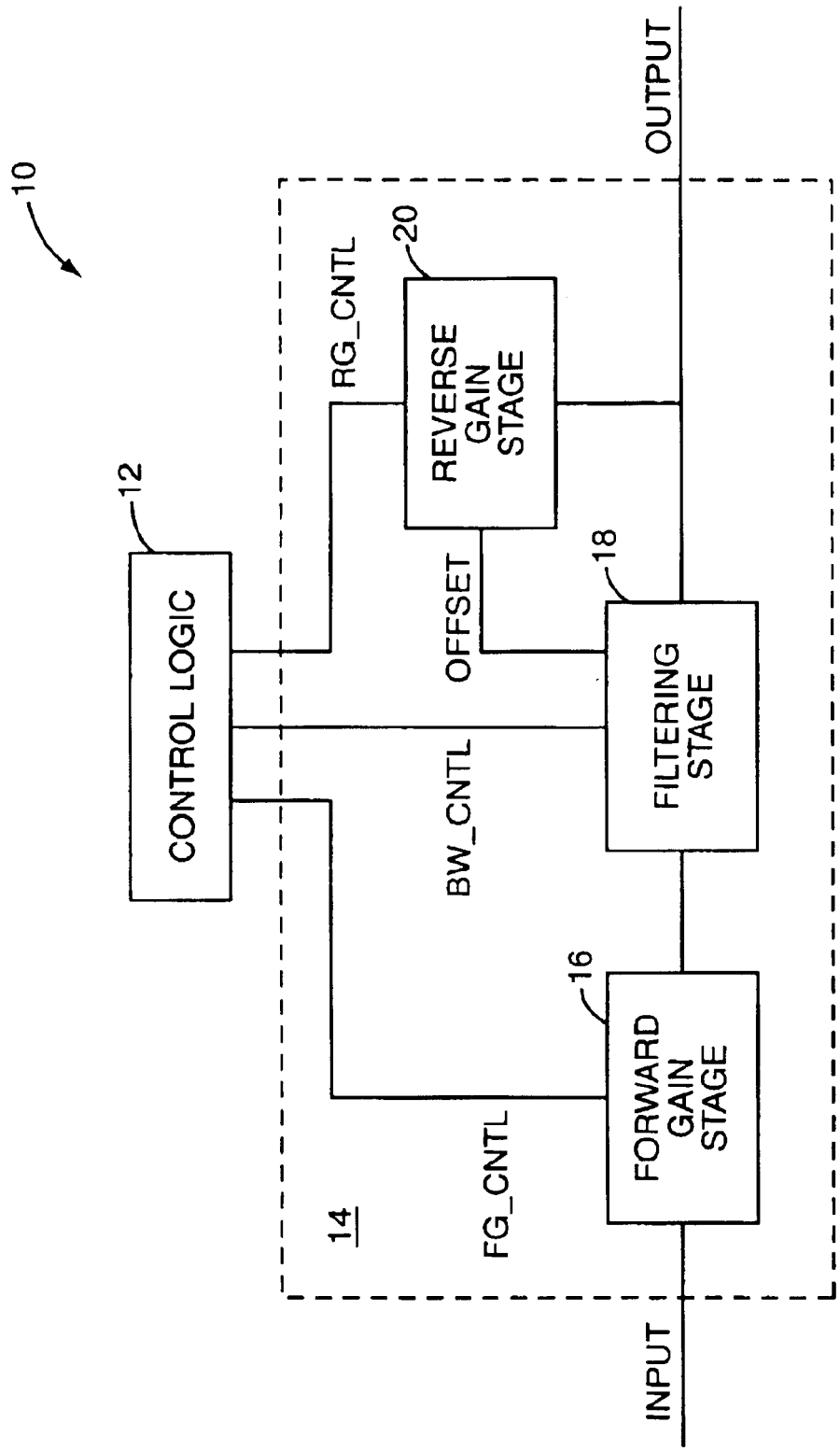
FIG. 1 is a general block diagram of a system including a reconfigurable filter according to the present invention.

FIG. 1 is a general block diagram of a system 10 including control logic 12 and a reconfigurable filter 14, wherein a gain, bandwidth, and frequency offset of the filter 14 are independently configured by the control logic 12. By independently configuring the bandwidth and frequency offset of the filter 14, the filter 14 can be configured to realize any filter pole. In addition, the gain of the filter 14 is configurable without adding additional gain stages.

In general, the filter 14 includes a forward gain stage 16, a filtering stage 18, and a reverse gain stage 20. The forward gain stage 16 receives an input signal (INPUT) and amplifies the input signal based on a forward gain control signal (FG_CNTL) from the control logic 12. The filtering stage 18 filters the amplified input signal from the gain stage 16 to provide an output signal (OUTPUT). The bandwidth of the filtering stage 18 is configured by a bandwidth control signal (BW_CNTL) from the control logic 12, and the frequency offset of the filtering stage 18 is configured by an offset control signal (OFFSET) from the reverse gain stage 20. The reverse gain stage 20 operates to provide the offset control signal (OFFSET) to the bandwidth stage 18 based on the output signal (OUTPUT) from the filtering stage 18 and a reverse gain control signal (RG_CNTL) from the control logic 12. Each of the forward gain, bandwidth, and reverse gain control signals may be a single control signal or multiple control signals depending on the particular design, as discussed below in more detail.

Figure 2A:
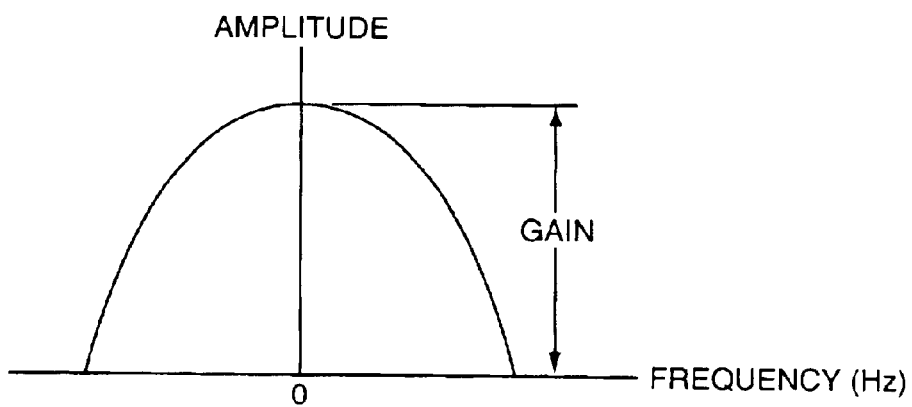
FIG. 2A illustrates configuration of the gain of the reconfigurable filter according to the present invention.
Figure 2B:
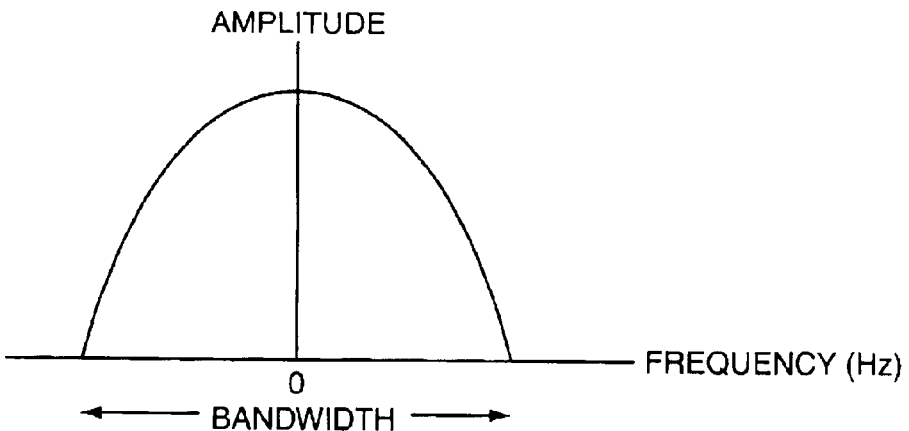
FIG. 2B illustrates configuration of the bandwidth of the reconfigurable filter according to the present invention.
Figure 2C:
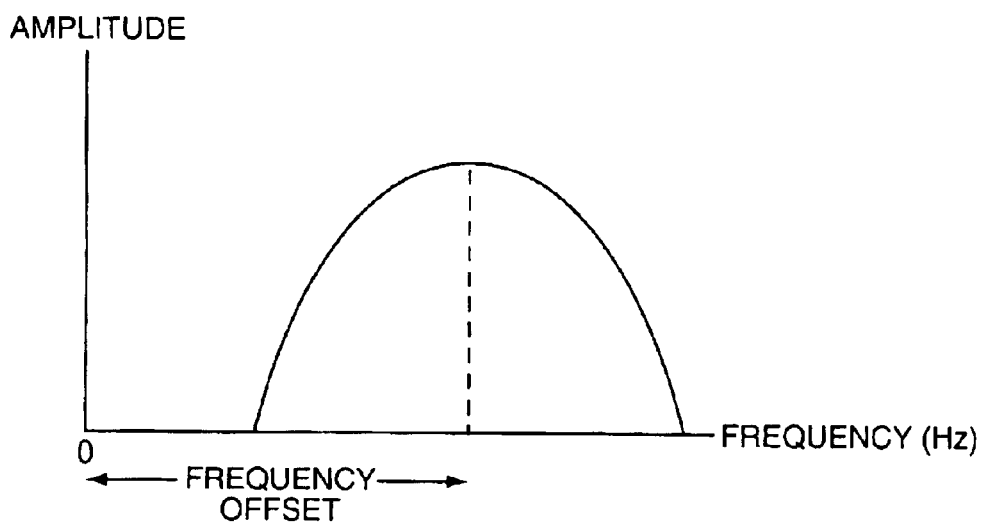
FIG. 2C illustrates configuration of the frequency offset of the reconfigurable filter according to the present invention.

FIGS. 2A–2C illustrate transfer functions of the filter 14 (FIG. 1) according to the present invention. FIG. 2A illustrates that the configuration of the gain of the filter 14 corresponds to a change in the amplitude of the transfer function of the filter 14. FIG. 2B illustrates that the configuration of the bandwidth of the filter 14 corresponds to a change in the width of the transfer function of the filter 14, and FIG. 2C illustrates that the configuration of the frequency offset of the filter 14 corresponds to a shift of the transfer function of the filter 14 from DC (0 Hz). According to the present invention, each of the gain, bandwidth, and frequency offset of the filter 14 are independently configured.

The transfer functions of FIGS. 2A–2C correspond to a preferred embodiment of the filter 14, wherein the filter 14 is a fully-complex filter adapted to realize fully-complex filter poles. Since the filter 14 is fully-complex, the filter 14 is capable of distinguishing between positive and negative frequencies. Thus, as is clearly illustrated in FIG. 2C, the transfer function of the filter 14 does not include a mirror image response located at a negative frequency.

Figure 3:
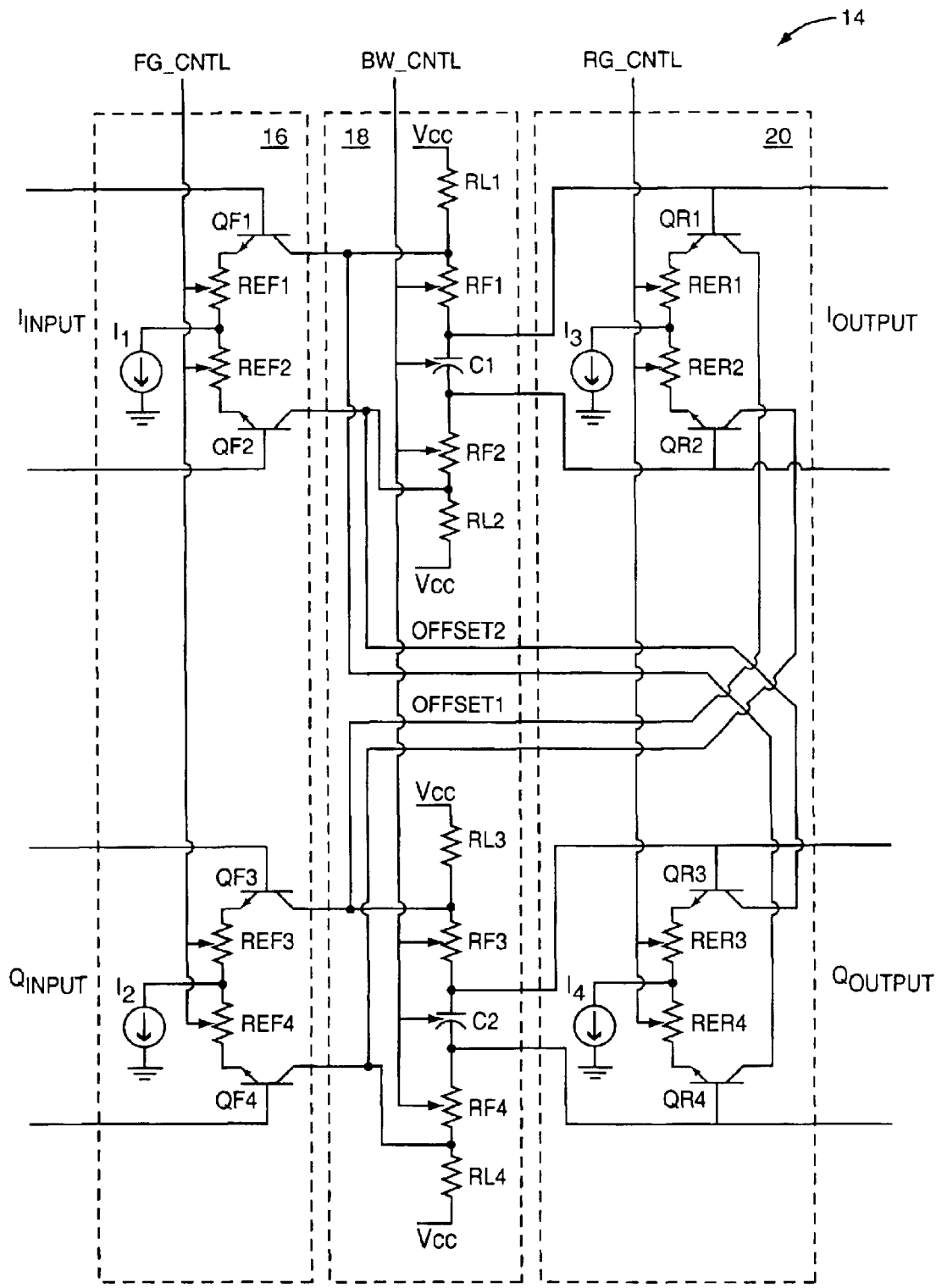
FIG. 3 illustrates the reconfigurable filter according to one embodiment of the present invention.

FIG. 3 illustrates one embodiment of the filter 14 of the present invention, wherein the filter 14 is a first order polyphase filter. In this embodiment, the input and output signals are differential quadrature signals. Accordingly, the input signal includes an in-phase input signal ($I_{INPUT}$) and a quadrature input signal ($Q_{INPUT}$), and the output signal includes an in-phase output signal $I_{OUTPUT}$ and a quadrature output signal ($Q_{OUTPUT}$).

The forward gain stage 16 includes transistors QF1 and QF2, first and second forward gain resistors REF1 and REF2, and a first current source 11 arranged as shown. The transistors QF1 and QF2 form a first transistor pair that operates to amplify the in-phase input signal ($I_{INPUT}$) based on the forward gain control signal. In a similar fashion, the forward gain stage 16 also includes transistors QF3 and QF3, third and fourth forward gain resistors REF3 and REF4, and a second current source 12 arranged as shown. The transistors QF3 and QF4 form a second transistor pair that operates to amplify the quadrature input signal ($Q_{INPUT}$) based on the forward gain control signal.

The filtering stage 18 receives the amplified in-phase and quadrature input signals from the forward gain stage 16. The filtering stage 18 includes first and second load resistors RL1 and RL2, first and second filtering resistors RF1 and RF2, and a first capacitor C1 arranged as shown and forming a first filtering circuit that filters the amplified in-phase input signal to provide the in-phase output signal ($I_{OUTPUT}$). The filtering stage 18 also includes third and fourth load resistors RL3 and RL4, third and fourth filtering resistors RF3 and RF4, and a second capacitor C2 arranged as shown and forming a second filtering circuit that filters the amplified quadrature input signal to provide the quadrature output signal ($Q_{OUTPUT}$).

The reverse gain stage 20 includes transistors QR1 and QR2, first and second reverse gain resistors RER1 and RER2, and a third current source 13 arranged as shown. The transistors QR1 and QR2 form a third transistor pair that operates to amplify the in-phase output signal ($I_{OUTPUT}$) based on the reverse gain control signal (RG_CNTL), thereby providing a first offset control signal (OFFSET1). The reverse gain stage 20 also includes transistors QR3 and QR4, third and fourth reverse gain resistors RER3 and RER4, and a fourth current source 14 arranged as shown. The transistors QR3 and QR4 form a fourth transistor pair that operates to amplify the quadrature output signal ($Q_{OUTPUT}$) based on the reverse gain control signal (RG_CNTL), thereby providing a second offset control signal (OFFSET2). In one embodiment, the in-phase output signal ($I_{OUTPUT}$) and the quadrature output signal ($Q_{OUTPUT}$) that drive the reverse gain stage 20 are essentially ninety degrees out of phase with the in-phase input signal ($I_{INPUT}$) and the quadrature input signal ($Q_{INPUT}$), respectively.

In the embodiment illustrated in FIG. 3, each of the resistors REF1–REF4, RF1–RF4, and RER1–RER4 is a variable resistor, each of the load resistors RL1–RL4 is a resistor having a fixed resistance value, and each of the capacitors C1 and C2 is a variable capacitor. The resistance values of the forward gain resistors REF1–REF4 are controlled by the forward gain control signal (FG_CNTL). Optionally, the forward gain control signal (FG_CNTL) may include separate control signals for each of the forward gain resistors REF1–REF4. The resistance values of the resistors RF1–RF4 and the capacitance values of the capacitors C1 and C2 are controlled by the bandwidth control signal (BW_CNTL). The bandwidth control signal (BW_CNTL) of this embodiment may include two control signals each controlling either the filtering resistors RF1–RF4 or the capacitors C1 and C2. Optionally, the bandwidth control signal (BW_CNTL) may include separate control signals for each of the filtering resistors RF1–RF4 and each of the capacitors C1 and C2. The reverse gain control signal (RG_CNTL) controls the resistance values of the reverse gain resistors RER1–RER4. Optionally, the reverse gain control signal (RG_CNTL) may include separate control signals for each of the reverse gain resistors RER1–RER4. In another embodiment, each of the resistors REF1–REF4 and RER1–RER4 is variable resistor, each of load resistors RL1–RL4 has a fixed resistor value, and the filtering resistors RF1–RF4 and/or the capacitors C1 and C2 are variable.

One example of a variable resistor is described is U.S. Pat. No. 6,552,519 entitled "Variable Impedance Network for an Integrated Circuit", which in incorporated herein by reference in its entirety. One example of a variable capacitor is described in U.S. Pat. No. 5,952,952 entitled "Switched-Capacitor Array", which is incorporated herein by reference in its entirety. Many other types of variable resistors and variable capacitors are commonly known in the art and should be considered within the spirit and scope of the present invention.

As discussed above, the gain, bandwidth, and frequency offset of the filter 14 are independently configurable. Preferably, the forward gain resistors REF1–REF4 have essentially the same resistance value, the load resistors RL1–RL4 have essentially the same resistance value, the filtering resistors RF1–RF4 have essentially the same resistance value, the reverse gain resistors RER1–RER4 have essentially the same resistance value, and the capacitors C1 and C2 have essentially the same capacitance value. Accordingly, the gain of the filter 14 is proportional to the ratio RL1/REF1, the bandwidth of the filter 14 is proportional to C1(RL1+RF1), and the frequency offset of the filter 14 is proportional to RER1. Thus, the gain is configured independently of the bandwidth and frequency offset by controlling the resistance values of the forward gain resistors REF1–REF4. The bandwidth is configured independently of the gain and the frequency offset by controlling the capacitances of the capacitors C1 and C2 and/or the resistance values of the filtering resistors RF1–RF4. The frequency offset is configured independently of the gain and the bandwidth by controlling the resistance of the reverse gain resistors RER1–RER4

The filter 14 of the present invention can be configured to realize any filter pole, wherein filter poles take the form X+jY, where X is the bandwidth and Y is the frequency offset. Thus, by independently configuring the bandwidth and frequency offset of the filter 14, as described above, any filter pole can be realized by the filter 14. Further, by cascading multiple filters 14, any complex filter having more than one filter pole can be realized. For example, a fourth order polyphase filter having any four filter poles can be realized by cascading four filters 14, wherein each of the filters 14 is configured to realize one of the four filter poles.

The filter 14 offers substantial opportunity for variation without departing from the spirit and scope of the present invention. For example, although FIG. 3 illustrates one embodiment of a reconfigurable polyphase filter 14, the present invention equally applies to other types of polyphase filters such as the Voorman polyphase filter described in U.S. Pat. No. 4,914,408 entitled "Asymmetric Polyphase Filter", which is incorporated herein by reference in its entirety. As another example, the transistor pairs QF1 and QF2, QF3 and QF4, QR1 and QR2, and QR3 and QR4 may be replaced with any number of alternative circuits including but not limited to a CMOS differential pairs, translinear circuits, and operational transconducance amplifiers (OTA's).

Those skilled in the art will recognize improvements and modifications to the preferred embodiments of the present invention. All such improvements and modifications are considered within the scope of the concepts disclosed herein and the claims that follow.

What is claimed is:

1. A reconfigurable filter comprising:
   a filtering stage having a bandwidth configured by a bandwidth control signal and a frequency offset configured by an offset control signal, the filtering stage adapted to filter an amplified input signal, thereby providing an output signal; and
   a reverse gain stage adapted to provide the offset control signal based on a reverse gain control signal and the output signal,
   wherein the configuration of the bandwidth and the frequency offset allows the reconfigurable filter to realize a desired filter pole.

2. The reconfigurable filter of claim 1 wherein the bandwidth is configured independently from the frequency offset and the frequency offset is configured independently from the bandwidth.

3. The reconfigurable filter of claim 1 further comprising a forward gain stage adapted to amplify an input signal to provide the amplified input signal to the filtering stage.

4. The reconfigurable filter of claim 3, wherein the forward gain stage has a gain configured by a forward gain control signal.

5. The reconfigurable filter of claim 4 wherein the gain is configured independently from the bandwidth and the frequency offset, the bandwidth is configured independently from the gain and the frequency offset, and the frequency offset is configured independently of the gain and the bandwidth.

6. The reconfigurable filter of claim 4 wherein the forward gain stage comprises at least one variable resistor having a resistance value controlled by the forward gain control signal.

7. The reconfigurable filter of claim 4 wherein the forward gain stage comprises at least one first variable resistor having a first resistance controlled by the forward gain control signal, the filtering stage comprises at least one second variable resistor having a second resistance controlled by the bandwidth control signal, and the reverse gain stage comprises at least one third variable resistor having a third resistance controlled by the reverse gain control signal.

8. The reconfigurable filter of claim 4 wherein the forward gain stage comprises at least one first variable resistor having a first resistance controlled by the forward gain control signal, the filtering stage comprises at least one variable capacitor having a capacitance controlled by the bandwidth control signal, and the reverse gain stage comprises at least one second variable resistor having a second resistance controlled by the reverse gain control signal.

9. The reconfigurable filter of claim 4 wherein the forward gain stage comprises at least one first variable resistor having a first resistance controlled by the forward gain control signal, the filtering stage comprises at least one variable capacitor having a capacitance controlled by the bandwidth control signal and at least one second variable resistor having a second resistance controlled by the bandwidth control signal, and the reverse gain stage comprises at least one third variable resistor having a third resistance controlled by the reverse gain control signal.

10. The reconfigurable filter of claim 4 wherein the forward gain control signal, the reverse gain control signal, and the bandwidth control signal are provided by control logic.

11. The reconfigurable filter of claim 1 wherein the reconfigurable filter is a polyphase filter.

12. The reconfigurable filter of claim 1 wherein the reconfigurable filter operates as a low-pass filter when the frequency offset is zero and a bandpass filter when the frequency offset is greater than zero.

13. The reconfigurable filter of claim 1 wherein the filtering stage comprises at least one variable resistor having a resistance value controlled by the bandwidth control signal.

14. The reconfigurable filter of claim 1 wherein the filtering stage comprises at least one variable capacitor having a capacitance controlled by the bandwidth control signal.

15. The reconfigurable filter of claim 1 wherein the filtering stage comprises at least one variable resistor and at least one variable capacitor each controlled by the bandwidth control signal.

16. The reconfigurable filter of claim 1 wherein the reverse gain stage comprises at least one variable resistor having a resistance controlled by the reverse gain control signal.

17. A method for providing a reconfigurable filter comprising the steps of:
   filtering an amplified input signal to provide an output signal, the filtering step having a bandwidth configured by a bandwidth control signal and a frequency offset configured by an offset control signal; and
   amplifying the output signal based on a reverse gain control signal, thereby providing the offset control signal,
   wherein the configuration of the bandwidth and the frequency offset allows the reconfigurable filter to realize a desired filter pole.

18. The method of claim 17 wherein the bandwidth is configured independently from the frequency offset and the frequency offset is configured independently from the bandwidth.

19. The method of claim 17 further comprising amplifying an input signal to provide the amplified input signal to the filtering step.

20. The method of claim 19, wherein the amplifying step has a gain configured by a forward gain control signal.

21. The method of claim 20 wherein the gain is configured independently from the bandwidth and the frequency offset, the bandwidth is configured independently from the gain and the frequency offset, and the frequency offset is configured independently of the gain and the bandwidth.

22. The method of claim 20 wherein the amplifying the input signal step comprises controlling at least one variable resistor based on the forward gain control signal.

23. The method of claim 20 wherein the amplifying the input signal step comprises controlling at least one first variable resistor having a first resistance based on the forward gain control signal, the filtering step comprises controlling at least one second variable resistor having a second resistance based on the bandwidth control signal, and the amplifying the output signal step comprises controlling at least one third variable resistor having a third resistance based on the reverse gain control signal.

24. The method of claim 20 wherein the amplifying the input signal step comprises controlling at least one first variable resistor having a first resistance based on the forward gain control signal, the filtering step comprises controlling at least one variable capacitor having a capacitance based on the bandwidth control signal, and the amplifying the output signal step comprises controlling at least one second variable resistor having a second resistance based on the reverse gain control signal.

25. The method of claim 20 wherein the amplifying the input signal step comprises controlling at least one first variable resistor having a first resistance based on the forward gain control signal, the filtering step comprises controlling at least one variable capacitor having a capacitance based on the bandwidth control signal and controlling at least one second variable resistor having a second resistance based on the bandwidth control signal, and the amplifying the output signal step comprises controlling at least one third variable resistor having a third resistance based on the reverse gain control signal.

26. The method of claim 17 wherein the reconfigurable filter is a polyphase filter.

27. The method of claim 17 wherein the filtering step operates to low-pass filter the amplified input signal when the frequency offset is zero and to bandpass filter the amplified input signal when the frequency offset is greater than zero.

28. The method of claim 17 wherein the filtering step comprises controlling at least one variable resistor based on the bandwidth control signal.

29. The method of claim 17 wherein the filtering step comprises controlling at least one variable capacitor based on the bandwidth control signal.

30. The method of claim 17 wherein the filtering step comprises controlling at least one variable resistor and at least one variable capacitor based on the bandwidth control signal.

31. The method of claim 17 wherein the amplifying the output signal step comprises controlling at least one variable resistor based on the reverse gain control signal.

32. A reconfigurable $N^{th}$ order filter comprising:
a number N of cascaded reconfigurable filters, each of the reconfigurable filters comprising:
a filtering stage having a bandwidth configured by a bandwidth control signal and a frequency offset configured by an offset control signal, the filtering stage adapted to filter an input signal, thereby providing an output signal; and
a reverse gain stage adapted to provide the offset control signal based on a reverse gain control signal and the output signal,
wherein the number N corresponds to a number of poles realized by the $N^{th}$ order filter and the configuration of the bandwidth and the frequency offset of each of the reconfigurable filters allows each of the reconfigurable filters to realize a desired filter pole.

33. The reconfigurable $N^{th}$ order filter of claim 32 wherein the bandwidth of each of the reconfigurable filters is configured independently from the frequency offset and the frequency offset is configured independently from the bandwidth.

34. The reconfigurable $N^{th}$ order filter of claim 32 wherein each of the reconfigurable filters further comprises a forward gain stage adapted to amplify the input signal prior and provide an amplified version of the input signal to the filtering stage.

35. The reconfigurable $N^{th}$ order filter of claim 34, wherein the forward gain stage of each of the reconfigurable filters has a gain configured by a forward gain control signal.

36. The reconfigurable $N^{th}$ order filter of claim 35 wherein the gain of each of the reconfigurable filters is configured independently from the bandwidth and the frequency offset, the bandwidth is configured independently from the gain and the frequency offset, and the frequency offset is configured independently of the gain and the bandwidth.

37. The reconfigurable filter of claim 35 wherein the forward gain control signal, the reverse gain control signal, and the bandwidth control signal are provided by control logic.

* * * * *